United States Patent
Aipperspach et al.

(10) Patent No.: US 7,562,267 B2
(45) Date of Patent: Jul. 14, 2009

(54) METHODS AND APPARATUS FOR TESTING A MEMORY

(75) Inventors: Anthony G. Aipperspach, Rochester, MN (US); Louis B. Bushard, Rochester, MN (US); Akihiko Fukui, Austin, TX (US); Garrett S. Koch, Jeffersonville, VT (US)

(73) Assignees: International Business Machines Corporation, Armonk, NY (US); Kabushiki Kaisha Toshiba, Tokyo (JP)

( * ) Notice: Subject to any disclaimer, the term of this patent is extended or adjusted under 35 U.S.C. 154(b) by 774 days.

(21) Appl. No.: 11/023,677

(22) Filed: Dec. 28, 2004

(65) Prior Publication Data
US 2006/0156091 A1 Jul. 13, 2006

(51) Int. Cl.
*G01R 31/28* (2006.01)
(52) U.S. Cl. ........................................ 714/712; 714/718
(58) Field of Classification Search ........................ None
See application file for complete search history.

(56) References Cited

U.S. PATENT DOCUMENTS

| | | | | |
|---|---|---|---|---|
| 4,534,028 A | * | 8/1985 | Trischler | 714/731 |
| 6,070,252 A | * | 5/2000 | Xu et al. | 714/30 |
| 6,681,354 B2 | * | 1/2004 | Gupta | 714/725 |
| 6,728,901 B1 | * | 4/2004 | Rajski et al. | 714/30 |
| 7,117,411 B2 | * | 10/2006 | McNeely et al. | 714/724 |
| 2001/0054166 A1 | * | 12/2001 | Fukuda | 714/733 |
| 2002/0138802 A1 | * | 9/2002 | Firth et al. | 714/733 |
| 2004/0246337 A1 | * | 12/2004 | Hasegawa et al. | 348/189 |
| 2005/0193298 A1 | * | 9/2005 | Inaba et al. | 714/726 |

* cited by examiner

*Primary Examiner*—Cynthia Britt
*Assistant Examiner*—Steven D Radosevich
(74) *Attorney, Agent, or Firm*—Dugan & Dugan, PC (57) ABSTRACT

In a first aspect, a first method is provided that includes the steps of (1) transmitting a first signal representative of a test operation from a test circuit to a memory via a first signal path; (2) transmitting a second signal, synchronized with the first signal, from the test circuit to the memory via a second signal path; and (3) initiating the test operation on the memory in response to the second signal arriving at the memory. Numerous other aspects are provided.

50 Claims, 5 Drawing Sheets

METHODS AND APPARATUS FOR TESTING A MEMORY

FIELD OF THE INVENTION

The present invention relates generally to computer systems, and more particularly to methods and apparatus for testing a memory within a computer system.

BACKGROUND

A computer system may include a chip that includes conventional logic (e.g., circuitry) for testing a memory using conventional approaches. However, such conventional approaches for testing the memory result in large processing and/or hardware overhead, and therefore, are costly. Further, some conventional approaches for testing a memory require an inflexible circuit design. Accordingly, improved methods and apparatus are desired for testing a memory within a computer system.

SUMMARY OF THE INVENTION

In a first aspect of the invention, a first method is provided. The first method includes the steps of (1) transmitting a first signal representative of a test operation from a test circuit to a memory via a first signal path; (2) transmitting a second signal, synchronized with the first signal, from the test circuit to the memory via a second signal path; and (3) initiating the test operation on the memory in response to the second signal arriving at the memory.

In a second aspect of the invention, a second method is provided. The second method includes the steps of (1) transmitting a first signal representative of stored test data from a memory to a test circuit via a first signal path; (2) transmitting a second signal, synchronized with the first signal, from the memory to the test circuit via a second signal path; and (3) employing the second signal to indicate arrival of the first signal at the test circuit.

In a third aspect of the invention, a third method is provided. The third method includes the steps of (1) transmitting a first signal representative of a test operation from a test circuit to a memory via a first signal path; (2) transmitting a second signal, synchronized with the first signal, from the test circuit to the memory via a second signal path; (3) initiating the test operation on the memory in response to the second signal arriving at the memory; (4) transmitting a third signal representative of stored test data from the memory to the test circuit via the first signal path; (5) transmitting the second signal, synchronized with the third signal, from the memory to the test circuit via the second signal path; and (6) employing the second signal to indicate arrival of the third signal at the test circuit.

In a fourth aspect of the invention, a fourth method is provided. The fourth method includes the steps of (1) transmitting a first signal representative of a test operation from a test circuit to a first memory via a first signal path; (2) transmitting a second signal, synchronized with the first signal, from the test circuit to the first memory via a second signal path; (3) transmitting the first signal from the test circuit to a second memory via a third signal path; (4) transmitting a third signal, synchronized with the first signal, from the test circuit to the second memory via a fourth signal path; (5) initiating the test operation on the first memory in response to the second signal arriving at the first memory; and (6) initiating the test operation on the second memory in response to the third signal arriving at the second memory. Numerous other aspects are provided in accordance with these and other aspects of the invention.

Other features and aspects of the present invention will become more fully apparent from the following detailed description, the appended claims and the accompanying drawings.

DETAILED DESCRIPTION

The present invention provides improved methods and apparatus for testing one or more memory arrays, which may be disposed throughout large integrated circuits. The present invention includes an integrated test circuit that is operable to automatically, and in parallel, for example, test multiple memory arrays of different sizes located different distances away from the test circuit. Further, the design of the test circuit may be independent of the size and location of the target memory arrays.

In some embodiments, the test circuit of the present invention may dispatch test operations to various target memory arrays via a serial signal path. Synchronized with the trailing end of each of the serial signals, a trigger signal may also be transmitted to each memory array via a separate but parallel trigger path. In some embodiments, the arrival of a trigger signal indicates to the memory array that the complete test operation, including address, data, and control information, has arrived at the target memory array and has been accumulated in a register. In response to the arrival of the trigger signal, the test operation may be applied to the memory array via a parallel bus interface.

In some embodiments, the results of the test operation are output from the memory array and serialized onto a return serial signal path back to the test circuit for comparison with expected data. Synchronized with the leading end of the return serial signal, the trigger signal may be transmitted back to the test circuit via a separate path but in parallel with the return serial signal. In some embodiments, the arrival of the trigger signal back at the test circuit indicates to the test circuit that a complete result of the test operation has arrived at the test circuit. In this manner, the use of the trigger signal relieves both the target memory arrays and the test circuit from having to be designed to predict when test operations and test results (respectively) will arrive based on timing.

Figure 1:
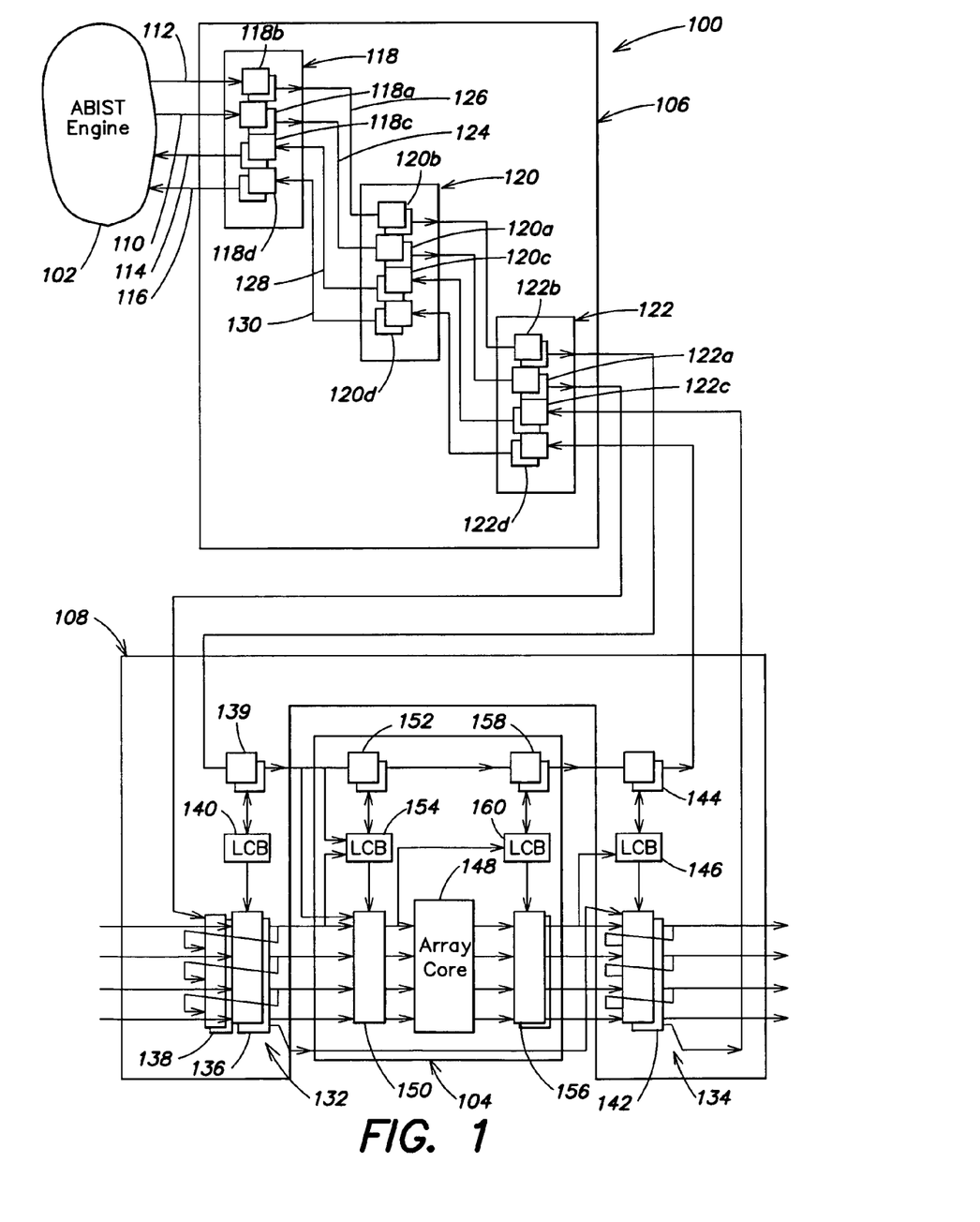
FIG. 1 is a block diagram of an apparatus for testing a memory in accordance with an embodiment of the present invention.

FIG. 1 is a block diagram of an apparatus for testing a memory in accordance with some embodiments of the present invention. With reference to FIG. 1, the apparatus 100 for testing a memory includes a test circuit 102 coupled to a memory 104 (or an array of the memory) via a communication register path 106 and a test circuit interface 108. The test circuit 102 generates and sends a test operation and a signal synchronized with the test operation to the memory 104. The test circuit 102 receives test results and a signal synchronized with the test results from the memory 104. Further, the test circuit 102 may generate expected values and compare the received test results to the expected values. In some embodiments, the test circuit is a circuit for performing autonomous (or automatic) built-in self-tests (ABIST). However, a test circuit for performing a different test may be employed. One or more outputs (e.g., a first 110 and second output 112) of the test circuit 102 is coupled to the communication register path 106 leading to the target memory 104. Further, one or more inputs (e.g., a first 114 and second input 116) of the test circuit 102 may be coupled to the communication register path 106 leading from the target memory 104.

The communication register path 106 may include a plurality of communication path registers 118-122 or buffers. Although four-bit registers are shown, larger or smaller communication path registers 118-122 may be employed. Each communication path register 118-122 may include a plurality of latches, each of which may be coupled to a corresponding latch included in one or more adjacent communication path registers 118-122. In this manner, the latches 118a-d, 120a-d and 122a-d form a plurality of scan chains that define one or more portions of a plurality of paths on which data may be transmitted one bit at a time (e.g., serially). Different length communication register paths 106 may be employed depending upon the distance between the test circuit 102 and the target memory 104.

For example, a first latch 118a, 120a, 122a in each of the communication path registers 118-122 form a first scan chain that defines (e.g., one or more portions of) a first path 124 (on which scan ABIST data may be transmitted) from the test circuit 102 to the memory 104 and similarly, a second latch 118b, 120b, 122b in each of the communication path registers 118-122 form a second scan chain that defines (e.g., one or more portions of) a second path 126 from the test circuit 102 to the memory 104. As will be described below, the test circuit 102 may transmit a test operation on the first path 124 to the memory 104 and a signal synchronized with the test operation on the second path 126 to the memory 104.

A third latch 122c, 120c, 118c in each of the communication path registers 122-118 may form a third scan chain that defines (e.g., one or more portions of) a first path 128 from the memory 104 to the test circuit 102 and similarly, a fourth latch 122d, 120d, 118d in each of the communication path registers 122-118 may form a fourth scan chain that defines (e.g., one or more portions of) a second path 130 from the memory 104 to the test circuit 102. As will be described below, the memory 104 may transmit a test result to the test circuit 102 on the first path 128 to the test circuit 102 and a signal synchronized with the test result on the second path 130 to the test circuit 102. In this manner, the first path 124 to the memory 104 and the first path 128 from the memory 104 form a first path of communication between the test circuit 102 and the memory 104. Similarly, the second path 126 to the memory 104 and the second path 130 from the memory 104 form a second path of communication between the test circuit 102 and the memory 104.

In the embodiment shown, the communication register path 106 includes three communication path registers 118-120, each of which includes four latches 118a-d, 120a-d, 122a-d. However, a larger or smaller number of communication path registers, latches corresponding to such registers and/or a different communication register path configuration may be employed.

In some embodiments, the communication register path 106 is coupled to the test circuit interface 108. More specifically, the first 124 and second paths 126 from the test circuit 102 to the memory 104 are coupled to respective portions of an input side 132 of the test circuit interface 108. Similarly, the first 128 and second paths 130 from the memory 104 to the test circuit 102 are coupled to respective portions of an output side 134 of the test circuit interface 108.

For example, the first path 124 to the memory 104 is coupled to a test circuit interface input register 136. For example, the first path 124 may be coupled to an input of a shadow register 138, the output of which is coupled the interface input register 136. In this manner, the interface input register 136 may store a first test operation and the shadow register 138 may store a second test operation output from the test circuit 102. The output of the interface input latch 136 is coupled to the memory 104.

Further, the second path 126 to the memory 104 is coupled to and input by a first latch 139 of the test circuit interface 108. The output of the first latch 139 is coupled to the memory 104. Both the interface input register 136 and the first latch 139 are coupled to and receive input from a first local clock buffer (LCB) 140 of the test circuit interface 108. In this manner, an LCB may synchronize a latch in the first and second paths.

Similarly, an output of a test circuit interface output register 142 is coupled to the first path 128 to the test circuit 102 and may serially output stored data. An output of a second latch 144 of the test circuit interface 108 is coupled to the second path 130 to the test circuit 102. The test circuit interface 108 includes a second local clock buffer 146 to which the second latch 144 is coupled.

The test circuit interface 108 is coupled to one or more inputs and outputs of the memory (or an array of the memory) 104. More specifically, the memory includes a memory (or array) core 148 that may be coupled to an output of the interface input register 136 via a first register 150 of the memory 104. The memory 104 includes a first latch 152 coupled to an output of the first latch 139 of the test circuit interface 108. A first local clock buffer 154 of the memory 104 is coupled to and receives inputs from the output of the interface input register 136 and first latch 139 of the test circuit interface 108 and outputs a signal based on such input. Both the first register 150 and first latch 152 of the memory 104 are coupled to and receive input (e.g., the output signal described above) from the first local clock buffer 154 of the memory 104. Such input causes test data corresponding to the test operation and the signal synchronized with the test operation to be loaded into memory 104 (and the first register 150 of the memory 104) once both signals arrive at the memory 104 (e.g., once both signals are output from the input side 132 of the test circuit interface 108).

The memory 104 may include a second register 156 coupled to an output of the memory core 148. An output of the second register 156 of the memory 104 may serve as a memory output and is coupled to an input of the interface output register 142. The memory 104 includes a second latch 158 coupled to an output of the first latch 152 of the memory 104. A second local clock buffer 160 of the memory 104 may be coupled to and receive input from an output of the first register 150 of the memory 104 and may output a signal based on such input. Both the second register 156 and second latch 158 of the memory 104 are coupled to and receive input (e.g., the output signal described above) from the second local clock buffer 160 of the memory 104. Such input causes data stored in the memory core 148 to be loaded into the second register 156 and the signal synchronized with the test operation to be loaded into the second latch 158 of the memory 104 once the second local clock buffer 160 receives input from the output of the first register 150.

Further, the output of the second register 156 of the memory 104 is coupled to and input by the second local clock buffer 146 of the test circuit interface 108. Based on such input the second local clock buffer 146 outputs a signal to (which serves as an input for) the interface output register 142 of the test circuit interface 108. Although not shown, a second LCB coupled to latch 144 may provide an input signal to the latch 144 and may be employed for ensuring synchronization with LCB 146 during the testing operation. Such inputs cause a signal representing data, which was stored in and unloaded from the memory core 148, and the signal synchronized with the test operation to be loaded into the test circuit interface 108 once both signals arrive at the test circuit interface 108 (e.g., once both signals are output from the memory 104) thereby synchronizing the signal, which was synchronized with the test operation, with the signal representing the unloaded data. In this manner, the communication register path 106 (along with the test circuit interface 108 define a communication path from the test circuit 102 to the memory 104 and vice versa.

Figure 2:
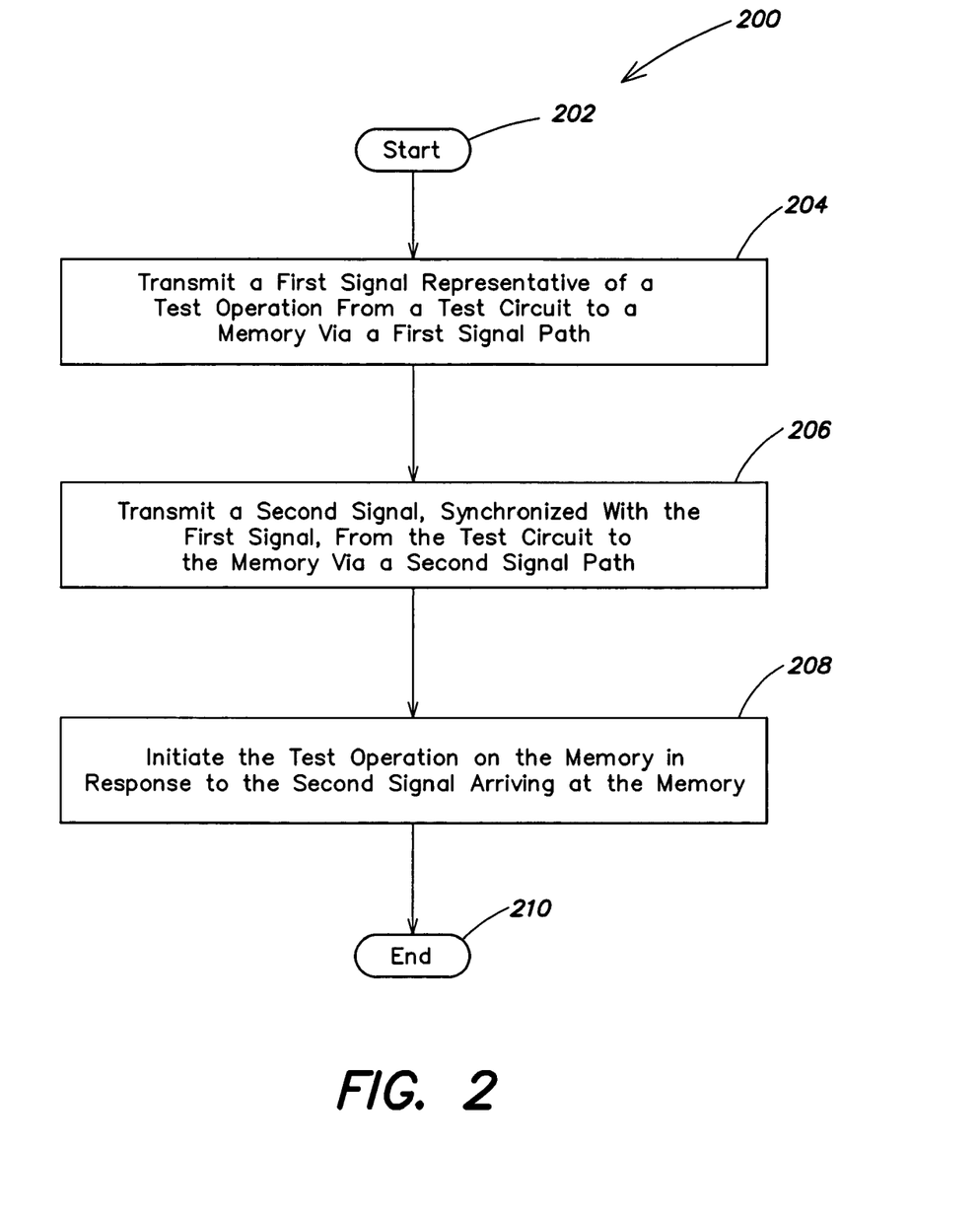
FIG. 2 illustrates a first exemplary method for testing a memory in accordance with an embodiment of the present invention.

The operation of the apparatus 100 for testing a memory is now described with reference to FIGS. 1 and 2, which illustrate a first exemplary method for testing a memory in accordance with some embodiments of the present invention. With reference to FIG. 2, in step 202, the method 200 begins. In step 204, a first signal representative of a test operation is transmitted from a test circuit to a memory via a first signal path. In some embodiments, the first signal is a digital signal transmitted in a serial manner. The first signal may include one or more control bits, address bits and/or data bits that represent the test operation to be performed on the memory. For example, the signal may include the bit pattern "1001 1100 1010" which, in some embodiments, might indicate that at address "1001", the data pattern "1100" is to be written. (In this example, "1010" represents a write command.)

The test circuit outputs the first signal on the first signal path such that information in the first signal may be stored in a test circuit interface. For example, the test circuit may output the first signal such that it is stored in an input register, which is coupled to a memory input, of the test circuit interface.

In some embodiments, the first signal may travel through a shadow register before the information in the signal is stored in the input register. In some embodiments that may include back to back test operations, the information in the first signal (or portions thereof) may also be stored in the shadow register.

As indicated in the hardware description above, one or more latches included in (e.g., each of) a plurality of registers (e.g., a first set of latches) may define the first signal path. For example, a first latch in each of the first through third registers define a portion of the first signal path from the test circuit to the memory. Therefore, each bit of the first signal may be transmitted from a first latch in the first register to a first latch in the second register (e.g., serially) along the first signal path. Each bit of the first signal is transmitted in a similar manner through the first latches of the additional registers toward the input register and loaded (e.g., serially) into the input register. In this manner, the serially transmitted test operation of the first signal may be assembled or aligned in the first input register of the test circuit interface so that the test operation may be applied in parallel to the memory under test.

In step 206, a second signal, synchronized with the first signal, is transmitted from the test circuit to the memory via a second signal path. The second signal may include a single bit (e.g., a trigger bit) that is synchronized with a bit (e.g., the last bit) of the first signal. The test circuit outputs the trigger bit on the second signal path at nearly the same time (e.g., during the same clock cycle) that the last bit of the first signal is output on the first signal path. As stated, one or more latches included in (e.g., each of) a plurality of registers (e.g., a second set of latches) define the second signal path. For example, second latches of each of the first through third registers define a portion of the second signal path from the test circuit to the memory. Therefore, the trigger bit of the second signal may be transmitted from a second latch in the first register to a second latch in the second register (e.g., serially) along the second signal path. The trigger bit is transmitted in a similar manner through the second latches of the additional registers toward the test circuit interface. The second signal path may be parallel to the first signal path. In this manner, the movement of the trigger bit along the second signal path is synchronized with the movement of the last bit, for example, of the first signal along the first signal path. For example, the last bit of the first signal and the trigger bit may be launched from respective latches in a first register of the plurality of registers at nearly the same time, and the last bit of the first signal and the trigger bit may be launched from respective latches in a second register of the plurality of registers at nearly the same time. The trigger bit and the last bit of the first signal are transmitted in a similar manner through additional registers toward the memory.

By synchronizing the second signal with the first signal, the second signal arrives at the memory at nearly the same time (e.g., during the same clock cycle) as the first signal (e.g., a last bit of the first signal). More specifically, the second signal is stored in a latch (e.g., interface input latch), which is coupled to a memory input, of the test circuit interface at nearly the same time as the first signal is stored (e.g., assembled) in the input register of the test circuit interface. For example, the trigger bit is stored in the interface input latch at nearly the same time as the last bit of the serially transmitted first signal is stored in the input register.

In step 208, the test operation is initiated on the memory in response to the second signal arriving at the memory. Based on the control, address and/or data bits of the first signal stored in the input register, the test circuit may perform read or write operation on the memory. The apparatus for testing the memory may employ the second signal to trigger loading test data into the memory. More specifically, once the first signal is stored in the input register the first signal is asserted on a memory input (e.g., an input of a first memory latch). Similarly, once the second signal is stored in the interface input latch, the second signal is asserted on another memory input (e.g., an input of a first memory register). Therefore, the first and second signals have arrived at the memory. Once the first and second signals arrive at the memory via respective signal paths, the second signal (e.g., along with a portion of the first test signal) is input by a first local clock buffer of the memory. In response to the second signal (e.g., trigger bit) input by the local clock buffer, the local clock buffer causes the trigger bit to be loaded into the first memory latch and one or more portions of the first signal, such as a data pattern, to be loaded (e.g., in parallel) from the input register to the memory. For example, the data pattern may be loaded into and/or stored by a memory core (e.g., via a first register of the memory) as test data. Thereafter, step 210 is performed. In step 210, the method 200 ends.

Additionally, one or more portions (e.g., the most significant bit) of the first signal may be input by a second local clock buffer included in the memory. In response to inputting such portion of the first signal, a second local clock buffer may cause (e.g., by providing a signal to) a second latch of the memory to store the trigger bit and cause a second register of the memory to store one or bits (e.g., stored data) output by the memory core. In this manner, the trigger bit is synchronized with stored data output from the memory.

In one or more embodiments, the test circuit may transmit a first signal representative of a test operation from a test circuit to a memory via a first signal path and transmit a second signal, synchronized with the first signal (e.g., a last bit of the first signal), from the test circuit to the memory via a second signal path such that the first signal is assembled in the input register. Further, the test circuit may transmit another signal (e.g., a third signal) representative of a subsequent test operation from the test circuit to the memory via the first signal path and transmit another signal (e.g., fourth signal), synchronized with the third signal (e.g., a last bit of the third signal), from the test circuit to the memory via the second signal path such that the third signal is stored in the shadow register of the test circuit interface. More specifically, in such embodiments, the serial transmission of the first and third signals may be interleaved. However, the first and third signals may be transmitted to the memory in a different manner. As described above, the test operation represented by the first signal is initiated on the memory in response to the second signal arriving at the memory. Thereafter, the subsequent operation represented by the third signal is initiated on the memory in response to the fourth signal arriving at the memory. In this manner, the test circuit may perform a test operation and a subsequent test operation as back-to-back operations. For example, the test circuit may perform successive read operations, successive write operations, a read operation followed by a write operation, or a write operation followed by a read operation on the memory.

Through the use of the method 200 of FIG. 2, a test circuit may perform a test operation on a memory (e.g., load data into the memory) without knowledge of the data path from the test circuit to the memory.

Figure 3:
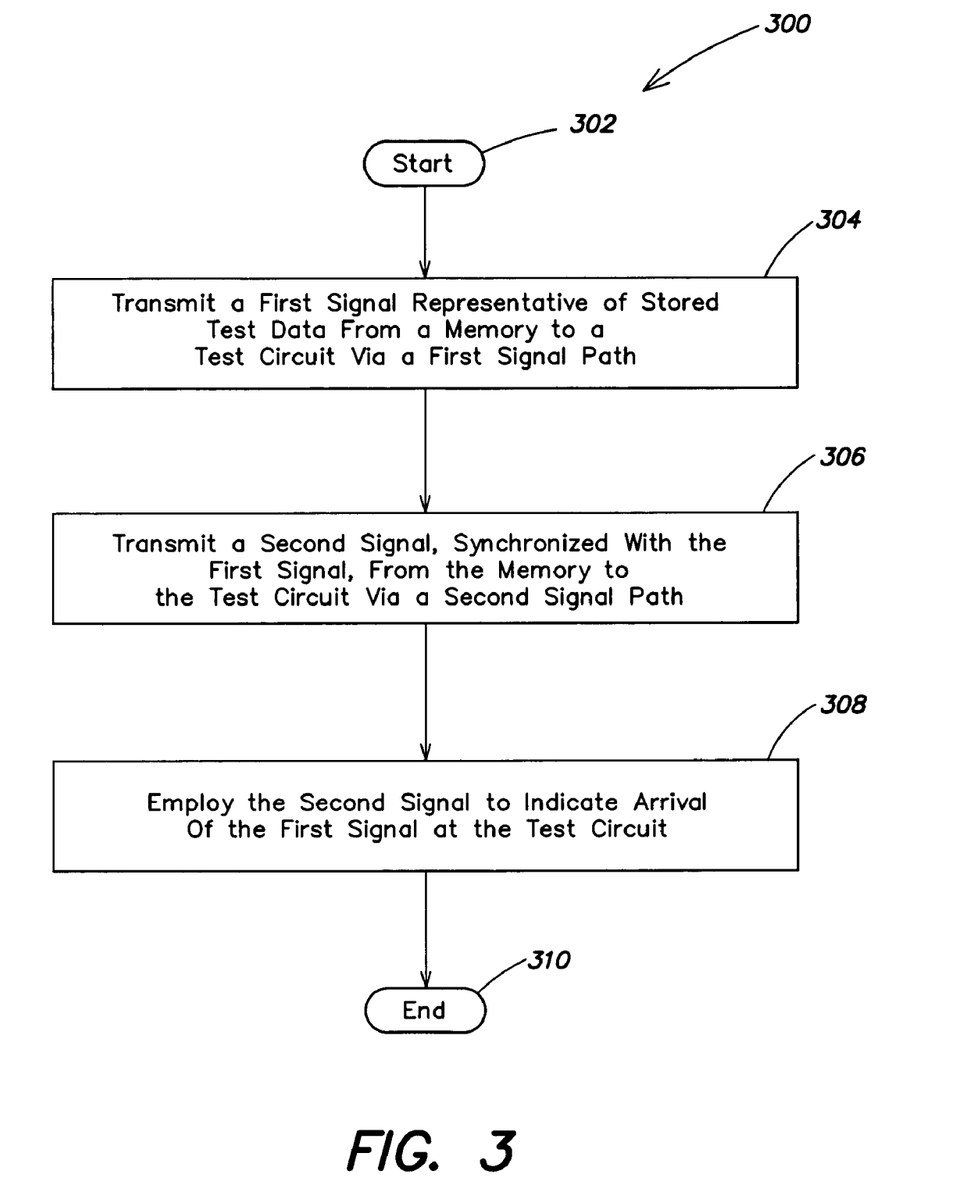
FIG. 3 illustrates a second exemplary method for testing a memory in accordance with an embodiment of the present invention.

Alternatively or additionally, a second exemplary method for testing a memory in accordance with an embodiment of the present invention may be performed. The operation of the apparatus 100 for testing a memory is now described with reference to FIG. 1, and with reference to FIG. 3, which illustrates the second exemplary method for testing a memory in accordance with an embodiment of the present invention. With reference to FIG. 3, in step 302, the method 300 begins. In step 304, a first signal representative of stored test data is transmitted from a memory to a test circuit via a first signal path. The first signal may include one or more bits which were stored in the memory (e.g., by a test operation performed on the memory). As stated, one or more latches included in (e.g., each of) a plurality of registers (e.g., a first set of latches) define the first signal path. For example, a third latch in each of the third through first registers define a portion of the first signal path from the memory to the test circuit. Therefore, each bit of the stored test data may be transmitted from a third latch in the third register to a third latch in the second register (e.g., serially) along the first signal path. Each bit of the first signal is transmitted in a similar manner through the third latches of the additional registers along the first signal path toward the test circuit.

The stored test data may be unloaded in parallel from the memory to the test circuit interface. More specifically, as stated above, a second register of the memory stores one or more bits (e.g., stored data) output by the memory core. Such bits may serve as the first signal. The memory (e.g., the second register of the memory) outputs the first signal representative of stored test data in parallel to an output register (e.g., interface output latch), which is coupled to a memory output, of the test interface circuit. A local clock buffer, which is coupled to a memory output, of the test circuit interface causes (e.g., by providing a signal to) the output register to input (e.g., and store) the first signal representative of stored test data in parallel. The output register serially outputs the first data toward the test circuit on the first signal path.

In step 306, a second signal, synchronized with the first signal, is transmitted from the memory to the test circuit via a second signal path. The second signal may include a single bit (e.g., a trigger bit) that is synchronized with one or more bits (e.g., the first bit) of the first signal. For example, the memory outputs the trigger bit (e.g., from the second latch of the memory) on the second signal path at nearly the same time (e.g., during the same clock cycle) as the one or more bits (e.g., the first bit) of the stored test data are output to the output register. In this manner, the trigger bit is output by the memory and stored by an output latch of the test circuit interface. As stated, one or more latches included in (e.g., each of) a plurality of registers (e.g., a second set of latches) define the second signal path. For example, fourth latches of each of the third through first registers define a portion of the second signal path from the memory to the test circuit. Therefore, the trigger bit may be transmitted from a fourth latch in the third register to a fourth latch in the second register (e.g., serially) along the second signal path. The trigger bit is transmitted in a similar manner through the fourth latches of the additional registers toward the test circuit interface. The second signal path may be parallel to the first signal path. In this manner, the movement of the trigger bit along the second signal path is synchronized with the movement of the first bit, for example, of the first signal along the first signal path. For example, the first bit of the first signal and the trigger bit may be launched from respective latches in a third register of the plurality of registers at nearly the same time, and the first bit of the first signal and the trigger bit may be launched from respective latches in a second register of the plurality of registers at nearly the same time. The trigger bit and the first bit of the first signal are transmitted in a similar manner through additional registers toward the test circuit.

In some embodiments, a trigger bit employed while transmitting a signal from the test circuit to the memory may be employed as the trigger bit for transmitting stored test data from the memory to the test circuit.

By synchronizing the second signal with the first signal, the second signal arrives at the test circuit at nearly the same time (e.g., during the same clock cycle) as the first signal (e.g., a first bit of the first signal).

In step 308, the second signal is employed to indicate arrival of the first signal at the test circuit. More specifically, when the second signal (e.g., trigger bit) is received by the test circuit from the second signal path, the test circuit is notified that a signal received on the first signal path is the first signal, which is representative of stored test data from the memory. Thus, the test circuit may store and/or process the stored test data received from the memory. For example, the test circuit may compare such test data with one or more expected values (e.g., expected test results) generated by the test circuit. Thereafter, step 310 is performed. In step 310, the method 300 ends.

Through use of the method 300 of FIG. 3, a test circuit may perform a test operation on a memory (e.g., unload data from the memory) without knowledge of the data path from the memory to the test circuit. Further, by use of the method 200 of FIG. 2 and the method 300 of FIG. 3, a test circuit may test a memory by initiating an operation on the memory and receiving results of the operation from the memory without knowledge of the data path from the test circuit to the memory and vice versa. In this manner, the test circuit may determine whether one or more portions of the memory are faulty.

Figure 4A:
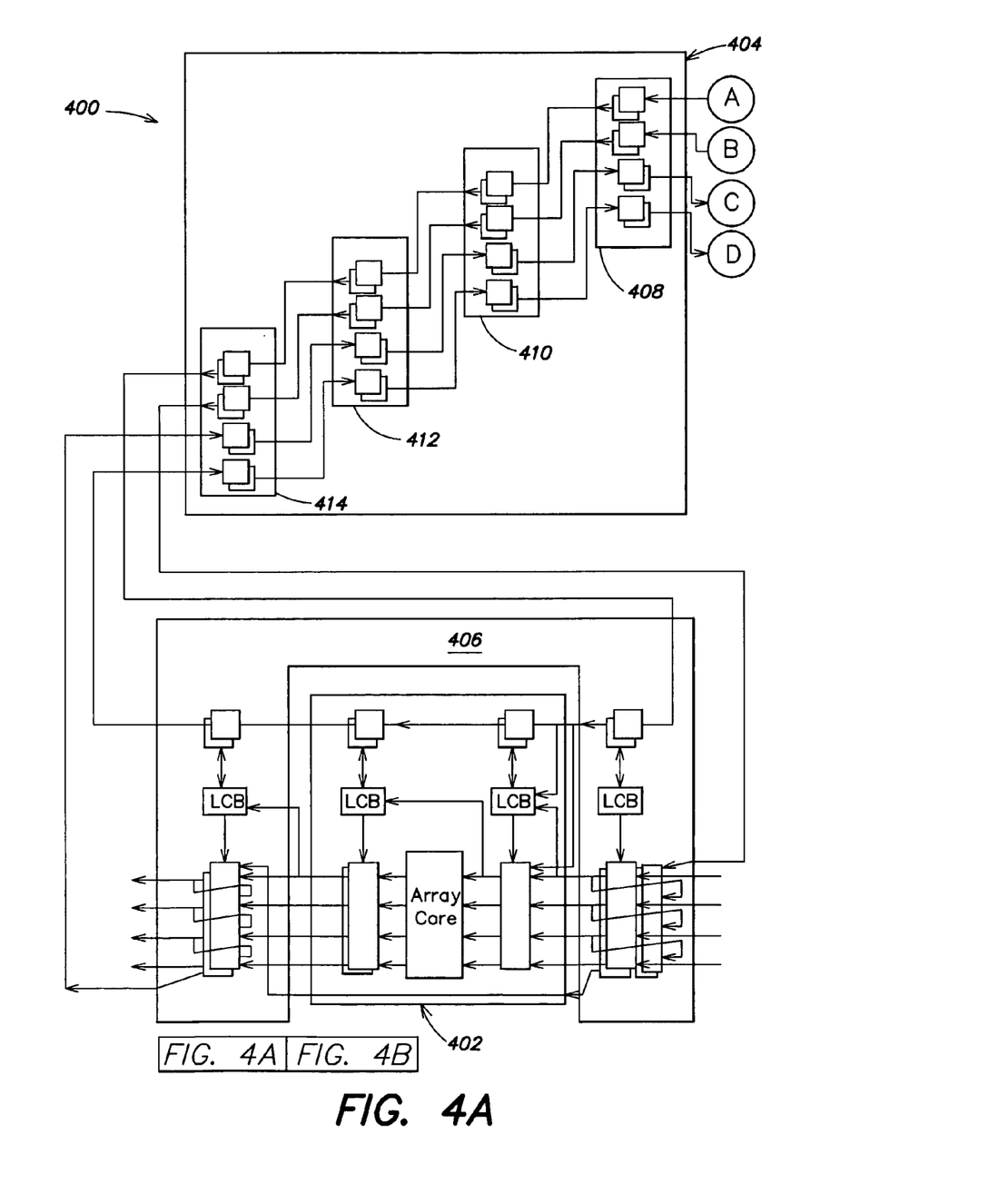
FIGS. 4A and 4B are a block diagram of an apparatus for testing a plurality of memories in accordance with an embodiment of the present invention.
Figure 4B:
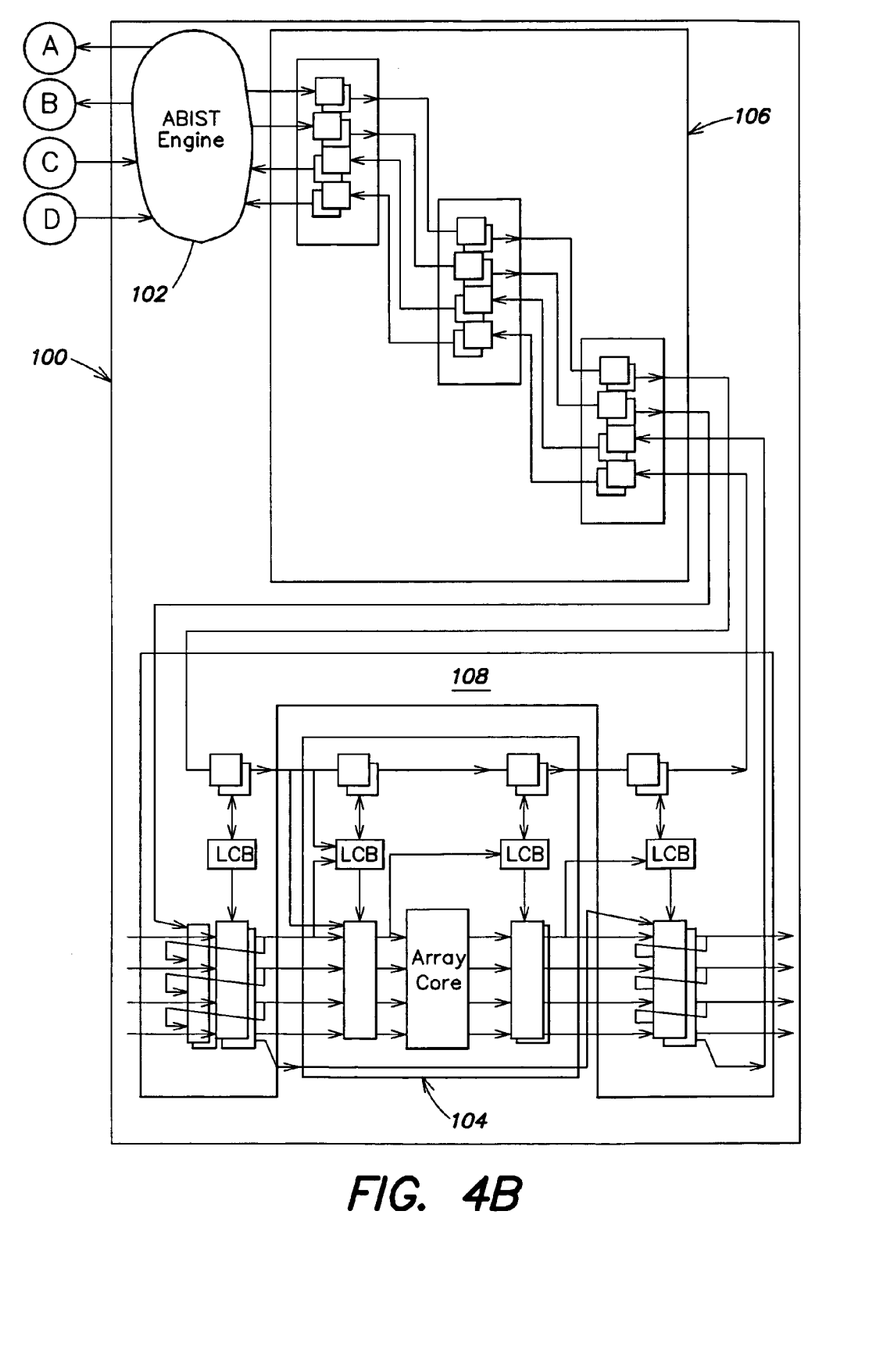

FIGS. 4A and 4B are a block diagram of an apparatus for testing a plurality of memories in accordance with an embodiment of the present invention. With reference to FIGS. 4A and 4B, the apparatus 400 for testing a plurality of memories is similar to the apparatus 100 for testing a memory. More specifically, the apparatus 400 for testing a plurality of memories may include the apparatus 100 for testing a memory, and therefore, the apparatus for testing a plurality of memories may include a test circuit 102 coupled to a first memory 104 via a first communication register path 106 and a first test circuit interface 108. Additionally, the test circuit 102 of the apparatus 400 may be coupled to a second memory 402 via a second communication register path 404 and a second test circuit interface 406. The second memory 402, second communication register path 404 and second test circuit interface 406 may be similar to the first memory 104, first communication register path 106 and first test circuit interface 108, respectively. However, the second memory 402 may be located a larger or smaller distance (e.g., on a larger circuit which includes the apparatus 400 for testing a plurality of memories) from the test circuit 102 than the first memory 104. Therefore, the second communication register path 404 may include a larger or smaller number, respectively, of communication path registers. In the embodiment shown, the second memory 402 is farther from the test circuit 102 than the first memory 104, and therefore, the second communication path includes a larger number of registers. More specifically, the second communication register path includes four registers 408-414. However, a larger number of registers may be employed to span larger distances.

Although not pictured, in some embodiments a test circuit may use portions of a single communication path to test more than one memory array. For example a test signal for two different memories may be propagated along a shared communication path that forks off to the two different memories after passing through three latches. In such an embodiment, the different memory arrays may employ dedicated return communication paths.

Although the apparatus 100, 400 illustrate one or more four-bit wide memories, larger or smaller memories may be employed. Further, the plurality of memories may differ in size. In such embodiments, the communication register path 106, 404 and the test circuit interface 108, 406 to such memories 104, 402 are modified accordingly.

In operation, the apparatus 400 may test each memory in a manner similar to the method 200 of FIG. 2 and/or method 300 of FIG. 3. More specifically, the apparatus 400 for testing a plurality of memories may transmit a first signal representative of a test operation from a test circuit to a first memory via a first signal path and may transmit a second signal, synchronized with the first signal, from the test circuit to the first memory via a second signal path. Further, the apparatus 400 may transmit the first signal from the test circuit to a second memory via a third signal path and may transmit a third signal, synchronized with the first signal, from the test circuit to the second memory 402 via a fourth signal path. The third and fourth signal paths may include a first and second path, respectively, from the test circuit 102 to the second memory 402, which are defined by the second communication register path 404. Thereafter, the apparatus 400 may initiate the test operation on the first memory in response to the second signal arriving at the first memory and may initiate the test operation on the second memory in response to the third signal arriving at the second memory.

The apparatus 400 may transmit a fourth signal representative of stored test data from the first memory to the test circuit via the first signal path and transmit the second signal, synchronized with the fourth signal, from the memory to the test circuit via the second signal path. Similarly, the apparatus 400 may transmit a fifth signal representative of stored test data from the second memory to the test circuit via the third signal path and may transmit the third signal, synchronized with the fifth signal, from the second memory to the test circuit via the fourth signal path. The third and fourth signal paths may include a first and second path, respectively, from the second memory 402 to the test circuit 102, which may be defined by the second communication register path 404. The apparatus 400 may employ the second signal to indicate arrival of the fourth signal at the test circuit 102 and employ the third signal to indicate arrival of the fifth signal at the test circuit 102.

In this manner, the present methods and apparatus may relieve one or more target memory arrays and/or a test circuit from having to be designed to predict when a test operation and test result (respectively) will arrive based on timing.

The configuration of the present apparatus 100 (e.g., use of scan chains) 400 allows the test circuit interface 108, 406 and memory 104, 402 to operate in a continuous scan mode, respectively. Since each array is in a continuous scan mode, no major mode changes need to happen at a chip level between SCAN and FUNCTIONAL mode. Therefore, a mode change is not required during the test. Further, all arrays do not have to be triggered at the same time. Further, the serial nature of the communications paths 124-130 reduces the number of wires between the test circuit (e.g., ABIST engine) 102 and the various arrays 104, 402. More specifically, with planning, portions of communications lines to a group of similar arrays may be shared. Therefore, the present methods and apparatus may reduce overall wiring required by the apparatus. Further, because the present methods and apparatus employ functional scan latches, no additional latches in the functional path or multiplexers (MUXs) are required.

By employing continuous clocking and functional scan latches, the present methods and apparatus may provide at-speed testing of the array functional paths.

The use of a trigger bit removes reliance of the test circuit on knowledge of the scan path. Consequently, the number of scan operations between the test circuit and memory array can be any arbitrary number and be increased as needed. Further, the trigger bit allows performance problems between the test circuit and the memory array to be solved by inserting an additional communication register to the apparatus. Such communication register may be added late in the design flow without affecting the design of the test circuit or memory array.

The use of shadow latches provides the capability to do back-to-back read or write operations, which may be necessary for generating array patterns that are adequate for testing. Because the shadow latches are placed in the scan path, they may not affect functional performance of the apparatus. Further, the shadow latches may reduce testing time (e.g., by half) by reducing the number of scan cycles, because two operations are now possible per scan.

In one embodiment, only the address and control signals get individual shadow latches per bit. In such embodiments, the interface data input register gets only one shadow latch for the entire signal. In this manner, the present apparatus provides independence of address and controls for successive operations, but has the cycle to cycle dependence of all 0s, all 1s or 101s to 010s for the data on successive operations. This trade-off allows for significant savings on the number of latches, yet gives us sufficient data control for test. Alternatively, the interface data input register may get a shadow latch for each bit of the entire signal.

The foregoing description discloses only exemplary embodiments of the invention. Modifications of the above disclosed apparatus and methods which fall within the scope of the invention will be readily apparent to those of ordinary skill in the art. For instance, as stated, although the communication register paths 106, 404 of FIGS. 4A and 4B are mutually exclusive, in other embodiments portions of communication register paths 106, 104 to different memories may overlap. Further, a signal path from the test circuit to a memory may be defined by a communication register path different than a signal path from the memory to the test circuit. Further, the apparatus 400 may send a different test operation to each memory while testing a plurality of memories (e.g., in parallel).

Accordingly, while the present invention has been disclosed in connection with exemplary embodiments thereof, it should be understood that other embodiments may fall within the spirit and scope of the invention, as defined by the following claims.

The invention claimed is:

1. A method, comprising:
   transmitting a first signal representative of a test operation from a test circuit to a memory via a first signal path to the memory;
   transmitting a second signal, synchronized with a completion of arrival of the first signal, from the test circuit to the memory via a second signal path to the memory; and
   initiating the test operation on the memory in response to the second signal arriving at the memory.

2. The method of claim 1 wherein the second signal is synchronized with an end of the first signal.

3. The method of claim 1 wherein transmitting the first signal representative of the test operation from the test circuit to the memory via the first signal path to the memory includes storing at least one of a control, address and data bit of the test operation in an input register coupled to the memory input.

4. The method of claim 3 further comprising storing at least one of a control, address and data bit of a subsequent test operation in a shadow register coupled to an input of the input register.

5. The method of claim 4 further comprising:
   initiating the subsequent test operation on the memory in response to a signal, synchronized with the subsequent test operation, arriving at the memory;
   wherein the test operation and subsequent test operation are performed as back-to-back operations.

6. The method of claim 4 wherein the shadow register includes a single latch for storing a data bit.

7. The method of claim 1 wherein:
   the first signal path to the memory is defined by a first set of one or more latches included in each of one or more communication path registers; and
   the second signal path to the memory is defined by a second set of one or more latches included in each of the one or more communication path registers.

8. The method of claim 1 wherein initiating the test operation on the memory in response to the second signal arriving at the memory includes employing the second signal to trigger loading test data into the memory.

9. A method, comprising:
   transmitting a first signal representative of stored test data from a memory to a test circuit via a first signal path to the test circuit;
   transmitting a second signal, synchronized with a completion of arrival of the first signal, from the memory to the test circuit via a second signal path to the test circuit; and
   employing the second signal to indicate arrival of the first signal at the test circuit.

10. The method of claim 9 further comprising comparing the first signal with expected values.

11. The method of claim 9 wherein transmitting the first signal representative of stored test data from the memory to the test circuit via the first signal path to the memory includes, in response to the second signal, storing the stored test data in an output register coupled to the memory output.

12. The method of claim 9 wherein:
   the first signal path to the test circuit is defined by a first set of one or more latches included in each of one or more communication path registers; and
   the second signal path to the test circuit is defined by a second set of one or more latches included in each of the one or more communication path registers.

13. A method, comprising:
   transmitting a first signal representative of a test operation from a test circuit to a memory via a first signal path to the memory;
   transmitting a second signal, synchronized with a completion of arrival of the first signal, from the test circuit to the memory via a second signal path to the memory;
   initiating the test operation on the memory in response to the second signal arriving at the memory;
   transmitting a third signal representative of stored test data from the memory to the test circuit via a first signal path to the test circuit;
   transmitting the second signal, synchronized with the third signal, from the memory to the test circuit via a second signal path to the test circuit; and
   employing the second signal transmitted from the memory to indicate arrival of the third signal at the test circuit.

14. The method of claim 13 wherein the second signal transmitted to the memory is synchronized with an end of the first signal.

15. The method of claim 13 wherein transmitting the first signal representative of the test operation from the test circuit to the memory via the first signal path to the memory includes storing at least one of a control, address and data bit of the test operation in an input register coupled to the memory input.

16. The method of claim 15 further comprising storing at least one of a control, address and data bit of a subsequent test operation in a shadow register coupled to an input of the input register.

17. The method of claim 16 further comprising:
   initiating the subsequent test operation on the memory in response to a signal, synchronized with the subsequent test operation, arriving at the memory;
   wherein the test operation and subsequent test operation are to be performed as back-to-back operations.

18. The method of claim 16 wherein the shadow register includes a single latch for storing a data bit.

19. The method of claim 13 wherein:
   the first signal path to the memory is defined by a first set of one or more latches included in each of one or more communication path registers; and
   the second signal path to the memory is defined by a second set of one or more latches included in each of the one or more communication path registers.

20. The method of claim 13 wherein initiating the test operation on the memory in response to the second signal arriving at the memory includes employing the second signal to trigger loading test data into the memory.

21. The method of claim 13 further comprising comparing the third signal with an expected value.

22. The method of claim 13 wherein transmitting the third signal representative of stored test data from the memory to the test circuit via the first signal path to the test circuit includes, in response to the second signal transmitted from the memory, storing the stored test data in an output register coupled to the memory output.

23. A method, comprising:
transmitting a first signal representative of a test operation from a test circuit to a first memory via a first signal path to the first memory;
transmitting a second signal, synchronized with a completion of arrival of the first signal, from the test circuit to the first memory via a second signal path to the first memory;
transmitting the first signal from the test circuit to a second memory via a first signal path to the second memory;
transmitting a third signal, synchronized with the first signal, from the test circuit to the second memory via a second signal path to the second memory;
initiating the test operation on the first memory in response to the second signal arriving at the first memory; and
initiating the test operation on the second memory in response to the third signal arriving at the second memory.

24. The method of claim 23 wherein:
the first signal path to the first memory is shorter than the first signal path to the second memory; and
the second signal path to the first memory is shorter than the second signal path to the second memory.

25. The method of claim 23 further comprising:
transmitting a fourth signal representative of stored test data from the first memory to the test circuit via the first signal path to the first memory;
transmitting the second signal, synchronized with the fourth signal, from the memory to the test circuit via the second signal path to the first memory;
transmitting a fifth signal representative of stored test data from the second memory to the test circuit via the first signal path to the second memory;
transmitting the third signal, synchronized with the fifth signal, from the second memory to the test circuit via the second signal path to the second memory;
employing the second signal to indicate arrival of the fourth signal at the test circuit; and
employing the third signal to indicate arrival of the fifth signal at the test circuit.

26. An apparatus, comprising:
a test circuit;
a test circuit interface adapted to couple to the test circuit and a memory; and
a plurality of registers, each of which includes a plurality of latches, adapted to define a first signal path to the memory and a second signal path to the memory and couple to the test circuit interface and the test circuit;
wherein the apparatus is adapted to:
transmit a first signal representative of a test operation from the test circuit to the memory via the first signal path to the memory;
transmit a second signal, synchronized with a completion of arrival of the first signal, from the test circuit to the memory via the second signal path to the memory; and
initiate the test operation on the memory in response to the second signal arriving at the memory.

27. The apparatus of claim 26 wherein the second signal is synchronized with an end of the first signal.

28. The apparatus of claim 26 wherein:
the test circuit interface includes an input register coupled to the first signal path to the memory and a memory input; and
the apparatus is further adapted to store at least one of a control, address and data bit of the test operation in the input register.

29. The apparatus of claim 28 wherein:
the test circuit interface includes a shadow register coupled to the first signal path to the memory and an input of the input register; and
the apparatus is further adapted to store at least one of a control, address and data bit of a subsequent test operation in the shadow register.

30. The apparatus of claim 29 wherein the apparatus is further adapted to:
initiate the subsequent test operation on the memory in response to a signal, synchronized with the subsequent test operation, arriving at the memory;
wherein the test operation and subsequent test operation are back-to-back operations.

31. The apparatus of claim 29 wherein the shadow register includes a single latch for storing a data bit.

32. The apparatus of claim 26 wherein the first signal path to the memory is defined by a first set of one or more latches included in each of the plurality of registers; and
the second signal path to the first memory is defined by a second set of one or more latches included in each of the plurality of registers.

33. The apparatus of claim 26 wherein the apparatus is further adapted to employ the second signal to load test data into the memory.

34. An apparatus, comprising:
a test circuit;
a test circuit interface adapted to couple to the test circuit and a memory; and
a plurality of registers, each of which includes a plurality of latches, adapted to define a first signal path to the test circuit and a second signal path to the test circuit and couple to the test circuit interface and the test circuit;
wherein the apparatus is adapted to:
transmit a first signal representative of stored test data from the memory to the test circuit via the first signal path to the test circuit;
transmit a second signal, synchronized with a completion of arrival of the first signal, from the memory to the test circuit via the second signal path to the test circuit; and
employ the second signal to indicate arrival of the first signal at the test circuit.

35. The apparatus of claim 34 wherein the apparatus is further adapted to compare the first signal with an expected value.

36. The apparatus of claim 34 wherein:
the memory includes a memory output;
the test circuit interface includes an output register coupled to the memory output and the first signal path to the test circuit; and
the apparatus is further adapted to, in response to the second signal, store the stored test data in the output register.

37. The apparatus of claim 34 wherein:
the first signal path to the test circuit is defined by a first set of one or more latches included in the plurality of registers; and the second signal path to the test circuit is defined by a second set of one or more latches included in the plurality of registers.

38. An apparatus, comprising:
a test circuit;
a test circuit interface adapted to couple to the test circuit and a memory; and
a plurality of registers, each of which includes a plurality of latches, adapted to define a first signal path to the memory, a second signal path to the memory, a first signal path to the test circuit, and a second signal path to the test circuit and couple to the test circuit interface and the test circuit;
wherein the apparatus is adapted to:
transmit a first signal representative of a test operation from the test circuit to the memory via the first signal path to the memory;
transmit a second signal, synchronized with a completion of arrival of the first signal, from the test circuit to the memory via the second signal path to the memory; and
initiate the test operation on the memory in response to the second signal arriving at the memory;
transmit a third signal representative of stored test data from the memory to the test circuit via the first signal path to the test circuit;
transmit the second signal, synchronized with a completion of arrival of the third signal, from the memory to the test circuit via the second signal path to the test circuit; and
employ the second signal to indicate arrival of the third signal at the test circuit.

39. The apparatus of claim 38 wherein the second signal is synchronized with an end of the first signal.

40. The apparatus of claim 38 wherein:
the test circuit interface includes an input register coupled to the first signal path to the memory and a memory input; and
the apparatus is further adapted to store at least one of a control, address and data bit of the test operation in the input register.

41. The apparatus of claim 40 wherein:
the test circuit interface includes a shadow register coupled to the first signal path to the memory and an input of the input register; and
the apparatus is further adapted to store at least one of a control, address and data bit of a subsequent test operation in the shadow register.

42. The apparatus of claim 41 wherein the apparatus is further adapted to:
initiate the subsequent test operation on the memory in response to a signal, synchronized with the subsequent test operation, arriving at the memory;
wherein the test operation and subsequent test operation are to be performed as back-to-back operations.

43. The apparatus of claim 41 wherein the shadow register includes a single latch for storing a data bit.

44. The apparatus of claim 38 wherein:
the first signal path to the memory is defined by a first set of one or more latches included in the plurality of registers;
the second signal path to the memory is defined by a second set of one or more latches included in the plurality of registers;
the first signal path to the test circuit is defined by a second set of one or more latches included in the plurality of registers; and
the second signal path to the test circuit is defined by a second set of one or more latches included in the plurality of registers.

45. The apparatus of claim 38 wherein the apparatus is further adapted to employ the second signal to load test data into the memory.

46. The apparatus of claim 38 wherein the apparatus is further adapted to compare the third signal with an expected value.

47. The apparatus of claim 38 wherein:
the test circuit interface includes an output register coupled to a memory output and the first signal path to the memory; and
the apparatus is further adapted to, in response to the second signal, store the stored test data in the output register.

48. An apparatus, comprising:
a test circuit;
a first test circuit interface adapted to couple to the test circuit and a first memory;
a first plurality of registers, each of which includes a first plurality of latches, adapted to:
define a first signal path to the first memory and a second signal path to the first memory; and
couple to the first test circuit interface and the test circuit;
a second test circuit interface adapted to couple to the test circuit and a second memory; and
a second plurality of registers, each of which includes a second plurality of latches, adapted to:
define a first signal path to the second memory and a second signal path to the second memory; and
couple to the second test circuit interface and the test circuit;
wherein the apparatus is adapted to:
transmit a first signal representative of a test operation from the test circuit to the first memory via the first signal path to the first memory;
transmit a second signal, synchronized with a completion of arrival of the first signal, from the test circuit to the first memory via the second signal path to the first memory;
transmit the first signal from the test circuit to the second memory via the first signal path to the second memory;
transmit a third signal, synchronized with a completion of arrival of the first signal, from the test circuit to the second memory via the second signal path to the second memory;
initiate the test operation on the first memory in response to the second signal arriving at the first memory; and
initiate the test operation on the second memory in response to the third signal arriving at the second memory.

49. The apparatus of claim 48 wherein:
the first signal path to the first memory is shorter than the first signal path to the second memory; and
the second signal path to the first memory is shorter than the second signal path to the second memory.

50. The apparatus of claim 48 wherein the apparatus is further adapted to:
transmit a fourth signal representative of stored test data from the first memory to the test circuit via the first signal path to the first memory;

transmit the second signal, synchronized with a completion of arrival of the fourth signal, from the memory to the test circuit via the second signal path to the first memory;

transmit a fifth signal representative of stored test data from the second memory to the test circuit via the first signal path to the second memory;

transmit the third signal, synchronized with a completion of arrival of the fifth signal, from the second memory to the test circuit via the second signal path to the second memory;

employ the second signal to indicate complete arrival of the fourth signal at the test circuit; and employ the third signal to indicate complete arrival of the fifth signal at the test circuit.

* * * * *